(12) United States Patent
Iino

(10) Patent No.: US 8,994,262 B2
(45) Date of Patent: Mar. 31, 2015

(54) LIGHT-EMITTING ELEMENT AND LIGHTING DEVICE USING THE SAME

(75) Inventor: Takashi Iino, Kofu (JP)

(73) Assignees: Citizen Electronics Co., Ltd., Yamanashi-ken (JP); Citizen Holdings Co., Ltd., Tokyo (JP)

( * ) Notice: Subject to any disclaimer, the term of this patent is extended or adjusted under 35 U.S.C. 154(b) by 289 days.

(21) Appl. No.: 13/615,866

(22) Filed: Sep. 14, 2012

(65) Prior Publication Data

US 2013/0076233 A1    Mar. 28, 2013

(30) Foreign Application Priority Data

Sep. 22, 2011   (JP) ................................. 2011-206988

(51) Int. Cl.
```
H05B 33/02      (2006.01)
H01L 33/48      (2010.01)
H01L 33/62      (2010.01)
H01L 33/50      (2010.01)
```

(52) U.S. Cl.
CPC .............. *H01L 33/486* (2013.01); *H01L 33/62* (2013.01); *H01L 33/507* (2013.01); *H01L 2924/0002* (2013.01)

USPC ........................................... 313/501; 313/292

(58) Field of Classification Search
None
See application file for complete search history.

(56) References Cited

U.S. PATENT DOCUMENTS

2011/0006664 A1 *  1/2011  Hamaguchi et al. .......... 313/358
2011/0266587 A1 * 11/2011  Naruse et al. ................... 257/99

* cited by examiner

*Primary Examiner* — Ashok Patel
(74) *Attorney, Agent, or Firm* — Browdy and Neimark, PLLC

(57) ABSTRACT

A light-emitting element according to an embodiment of the present invention includes a body including an upper surface, a lower surface opposite to the upper surface, and a peripheral side surface extending between peripheral edges of the upper surface and peripheral edges of the lower surface, the peripheral side surface including a front surface and a rear surface opposite to the front surface; a pair of element electrodes as a first element electrode and a second element electrode positioned at the rear surface of the body; and a support disposed at the rear surface of the body between the first element electrode and the second element electrode that are positioned at a lower area of the rear surface of the body.

17 Claims, 12 Drawing Sheets

LIGHT-EMITTING ELEMENT AND LIGHTING DEVICE USING THE SAME

CROSS-REFERENCE TO RELATED APPLICATION

This application is based on and claims the priority benefit of Japanese Patent Application No. 2011-206988, filed on Sep. 22, 2011, the disclosure of which is incorporated herein by reference in its entirety.

BACKGROUND OF THE INVENTION

1. Field of the Invention

The present invention relates to a light-emitting element and a lighting device using the light-emitting element as a light source.

2. Description of the Related Art

There has been a light-emitting diode element (hereinafter, referred to as an LED element) as a light-emitting element, which includes a body including a PN junction structure with a pair of element electrodes in which part of a P layer and an N layer are exposed on a surface of the body. The LED element with such a structure, which is mounted on a circuit substrate and electrically connected to the circuit substrate, for example, through a bump (s), a wire (s), and so on, has been known as an LED package. Such an LED package may include a pair of electrodes disposed on the circuit substrate, a reflecting member, and other components disposed on the circuit substrate. The circuit substrate of the LED package is mounted on a board as a mother board of a lighting device and/or a system with light-emitting properties.

When the LED element is mounted on the surface of the circuit substrate, a PN junction surface has been disposed at a central portion of a LED element body and the pair of element electrodes are positioned to be exposed from the LED element on both sides of the LED element body. The pair of element electrodes are electrically connected to the pair of electrodes disposed on the circuit substrate through indium (see Japanese Utility Model Application Laid-Open No. Sho. 52-157769).

Further, a circuit substrate on which the LED element is mounted is disposed with a predetermined angle inclined to a specific direction (see Japanese Utility Model Application Laid-Open No. Sho. 63-022759).

FIG. 12 is an explanation drawing showing a light-emitting element 1 including a pair of element electrodes as a first element electrode 3a and a second element electrode 3b, in a state that the light-emitting element 1 is unfavorably inclined backward on a surface of a board 5, because of a hardening effect of a first solder 9a and a second solder 9b through a reflow process. A lower surface of a first element electrode 3a should be in contact with a first electrode 7a of the board 5 and a lower surface of a second element electrode 3b should be in contact with a second electrode 7b of the board 5, however, the first element electrode 3a tends to be pulled backward at a first connecting portion P1 that is a rear edge of the lower surface of the first element electrode 3a and the second element electrode 3b tends to be pulled backward at a second connecting portion P2 that is a rear edge of the lower surface of the second element electrode 3b through a reflow process. In other words, the light-emitting element 1 is pulled backward at the first connecting portion P1 and the second connecting portion P1 that are in alignment with each other as an axis of unfavorable inclination caused by a hardening effect of solder through a reflow process.

SUMMARY OF THE INVENTION

It is an object of the present invention to provide a light-emitting element with a pair of element electrodes as a first element electrode and a second element electrode can be stably disposed on a surface a board of electronic equipment such as a lighting device, a portable device, etc. Further, it is another object of the present invention to provide a structure of a light-emitting element with a pair of element electrodes as a first element electrode and a second element electrode that are configured to be electrically connected to a pair of electrodes as a first electrode and a second electrode provided on a surface of the board, even if a lower surface of a body of the light-emitting element is to be disposed at an angle with respect to the surface of the board. It is also another object of the invention to provide a lighting device including a board and the light-emitting element mounted on the board.

The light-emitting element according to an embodiments of the present invention includes: a body including an upper surface, a lower surface opposite to the upper surface, a peripheral side surface extending between peripheral edges of the upper surface and peripheral edges of the lower surface, and the peripheral side surface including a front surface and a rear surface opposite to the front surface; a pair of element electrodes as a first element electrode and a second element electrode positioned at the rear surface of the body; and a support disposed on the rear surface of the body between the first element electrode and the second element electrode positioned at the rear surface of the body.

The support includes an upper surface and a lower surface opposite to the upper surface, and the upper surface of the support is flush with the upper surface of the body. In a first embodiment, the lower surface of the support is flush with the lower surface of the body.

According to a first embodiment of a lighting device of the present invention including a light-emitting element that is disposed on a board, the lighting device includes a board as a motherboard that includes a pair of electrodes as a first electrode and a second electrode that are disposed on the surface of the board; and a light-emitting element disposed on the board with the first element electrode of the light-emitting element in contact with the first electrode of the board and with the second element electrode of the light-emitting element in contact with the second electrode of the board. Moreover, in the first embodiment of the lighting device, the lower surface of the support is in contact with the board.

The first element electrode of the light-emitting element is electrically connected to the first electrode of the board by soldering, and the second element electrode of the light-emitting element is electrically connected to the second electrode of the board by soldering. The lower surface of the body of the light-emitting element may be disposed to be parallel with the surface of the board. The support includes a supporting portion that is a rear edge of a lower surface of the support. Since the supporting portion of the support is positioned rearward of the first connecting portion P1 that is a rear edge of the lower surface of the first element electrode and rearward of the second connecting portion P2 that is a rear edge of the lower surface of the second element electrode, the support holds the light-emitting element on the surface of the board even through a reflow process.

In one embodiment, the shape of the support disposed at the rear surface of the body of the light-emitting element may resemble the shape of I in a rear plan view. In another embodiment, the shape of the support disposed at the rear surface of the light-emitting element may resemble the shape of T in a rear plan view. In this embodiment of the present invention, it is possible to stabilize the position of the light-emitting element on the surface of the board due to the existence of the support. The shape, weight, and/or size of the support can be changed, according to a size of body of the light-emitting element, a balance of the light-emitting element when disposed on a board, and so on.

Furthermore, a light-emitting element according to a second embodiment of the light-emitting element includes a support, and a lower surface of the support may include a slope that slopes upward from a position that is adjacent to the lower surface of the body.

Also, as a second lighting device, the lighting device may include a board with a first electrode and a second electrode disposed on a surface of the board, and the light-emitting element including the support with the slope. The light-emitting element may be disposed on the upper surface of the board with the first element electrode of the light-emitting element in contact with the first electrode of the board and with the second element electrode of the light-emitting element in contact with the second electrode of the board, and the lower surface of the support that includes the slope that slopes upward from a position adjacent to the lower surface of the body and is in contact with the surface of the board.

In the second embodiment of the lighting device, the lower surface of the body of the light-emitting element may be inclined at an angle with respect to the surface of the board. The support of the light-emitting element supports and holds the light-emitting element in a stable disposition of the light-emitting element even when disposed at an angle with respect to the surface of the board.

In this embodiment, since the supporting portion P3 is a rear edge of the lower surface of the support and the slope of the lower surface of the support is in contact with the surface of the board, the support can stably support and hold the light-emitting element at an angle, even through a reflow process.

In addition, the light-emitting element may be combined with a phosphor that converts at least part of light from the light-emitting element. When the phosphor is provided, the phosphor may be disposed directly on a light-emitting surface of the light-emitting element, or in an embodiment of the lighting device application, a phosphor may be disposed above the light-emitting element in the shape of a phosphor plate or a phosphor cover.

DETAILED DESCRIPTION OF EMBODIMENTS

Figure 1:
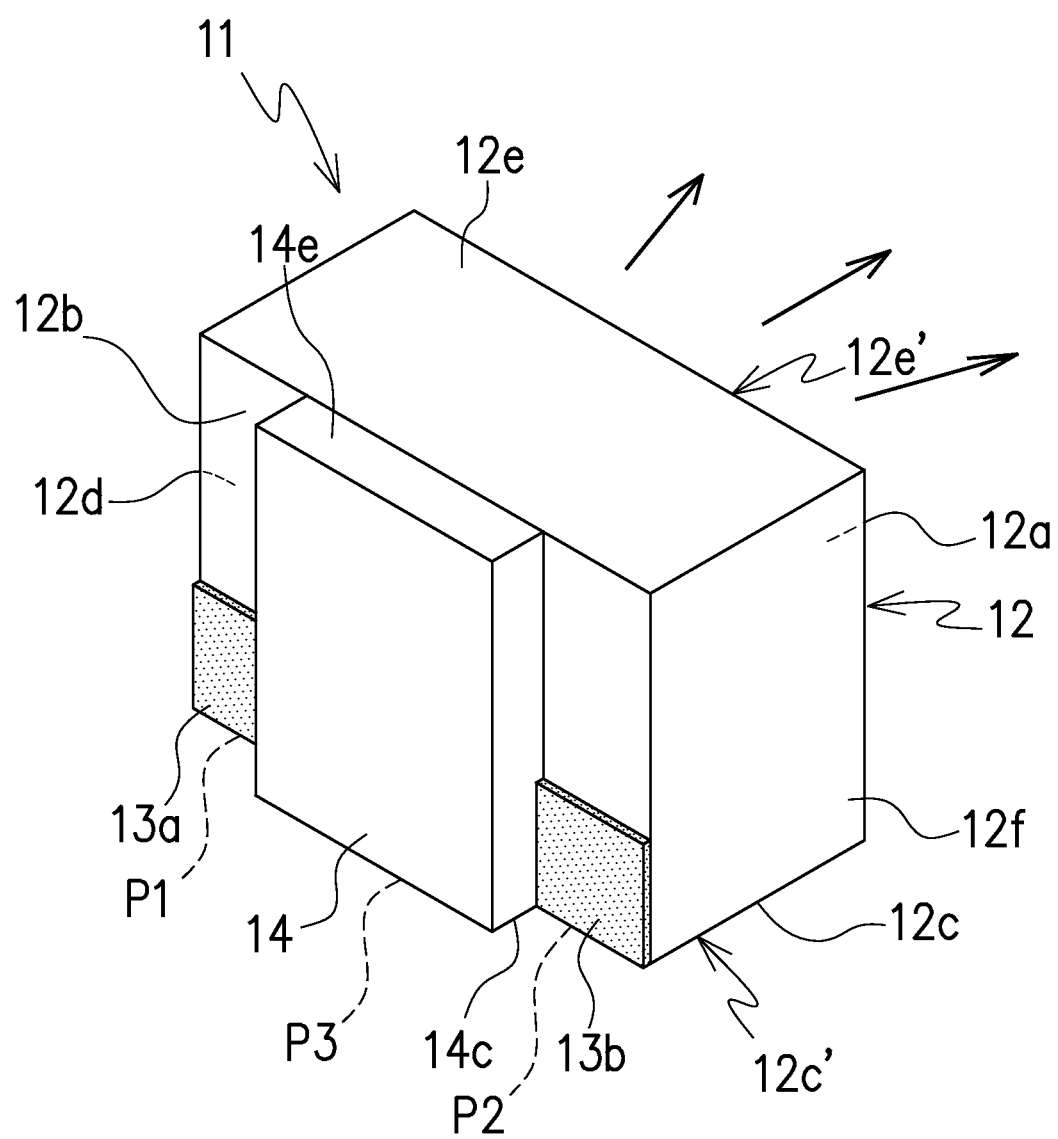
FIG. 1 is a perspective view of a light-emitting element according to a first embodiment of the present invention as viewed from a rear surface side.

The following detailed description refers to the accompanying drawings, which illustrate embodiments of the present invention. Other embodiments including different structures and/or operation do not depart from the scope of the present invention.

Embodiments of the invention are described with reference to drawings included herewith. Like reference numbers refer to like structures throughout. It should be noted that the drawings are schematic in nature. Not all parts are always shown to scale.

A light-emitting element 11 according to an embodiment of the present invention includes a body 12 including an upper surface 12e, a lower surface 12c opposite to the upper surface 12e, a peripheral side surface extending between peripheral edges 12e' of the upper surface and peripheral edges 12c' of the lower surface 12c, and the peripheral side surface including a front surface 12a and a rear surface 12b opposite to the front surface 12a, a pair of element electrodes as a first element electrode 13a and a second element electrode 13b that are positioned at the rear surface 12b of the body 12, and a support 14 disposed on the rear surface 12b of the body 12 between the first element electrode 13a and the second element electrode 13b positioned at the rear surface of the body 12. The first element electrode 13a and the second element electrode 13b are positioned at a lower area of the rear surface 12b of the body 12, and the first element electrode 13a and the second element electrode 13b are disposed with an interval between the first element electrode 13a and the second element electrode 13b. The support 14 is disposed at the interval between the first element electrode 13a and the second element electrode 13b on the rear surface 12d of the body 12. The support 14 projects from the rear surface 12d of the body 12.

First Embodiment

Embodiments of the light-emitting element according to the present invention will be described below in detail with reference to the accompanying drawings. FIGS. 1 to 4 show a structure of a light-emitting element 11 according to a first embodiment of the present invention. In this embodiment, a body 12 of the light-emitting element 11 includes a PN junction structure. The light-emitting element 11 includes a substantially hexahedral body 12 including an upper surface 12e, a lower surface 12c, peripheral side surfaces, i.e. a front surface 12a, a rear surface 12b opposite to the front surface 12a, a first side surface 12d, and a second side surface 12f opposite to the first side surface 12d; a pair of element electrodes including a first element electrode 13a and a second element electrode 13b, in which, for example, a part of a P layer of a PN junction structure may be exposed as a first element electrode 13a and a part of an N layer of the PN junction structure may be exposed as a second element electrode 13b at the rear surface 12b of the body 12; and a support 14 disposed to be projected at a center portion of the rear surface 12b of the body 12 between the first element electrode 13a and the second element electrode 13b.

The support 14 includes an upper surface 14e and a lower surface 14c opposite to the upper surface 14e, and the upper surface 14e of the support 14 is flush with the upper surface 12e of the body 12. Also, the lower surface 14c of the support 14 is flush with the lower surface 12c of the body 12. In this embodiment, the support 14 includes a rectangular parallelepiped shape smaller than the body 12 in thickness and width, but the support 14 is the same as the body 12 in height. The support 14 appears in a shape resembling I in a rear plan view.

Further, in this embodiment, the first element electrode 13a positioned at the rear surface 12b of the body 12 is disposed at the position that is adjacent to the first side surface 12d of the body 12 and the lower surface 12c of the body 12, and the second element electrode 13b is disposed at the position that is adjacent to the second side surface 12f of the body 12 and the lower surface 12c of the body 12.

As for the body 12, the front surface 12a opposite to the rear surface 12b can be a light-emitting surface. In this case, a phosphor may be disposed on the front surface 12a of the body 12. Five surfaces of the body 12, i.e., the upper surface 12e, the lower surface 12c, the first side surface 12d, the second side surface 12f, and the front surface 12a, can be light-emitting surfaces. In this case, the peripheral side surface of the body except the rear surface 12b may be a light-emitting surface, and a phosphor may be disposed on the peripheral side surface of the body except the rear surface. Moreover, the number of the light-emitting surface can be selected by disposing a shading material on the surface that is not used as a light-emitting surface.

Figure 3:
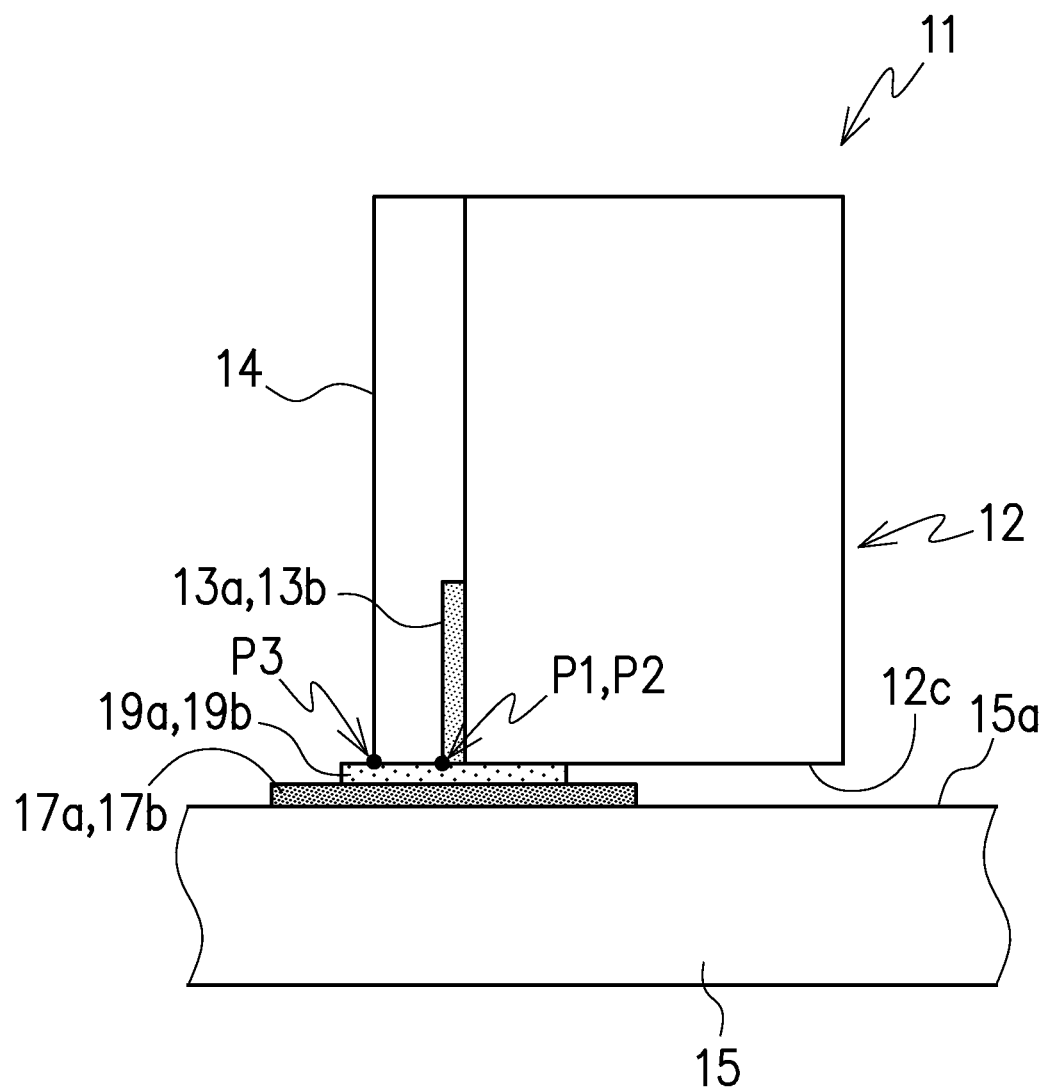
FIG. 3 is a side view illustrating a first mounting embodiment to mount the light-emitting element on a surface of a board.

The light-emitting element 11 according to the first embodiment of the present invention can be mounted on a board and used in the board of a lighting device or electronic equipment, etc. In a first mounting embodiment to mount the light-emitting element on a surface of a board as shown in FIG. 3, a board 15 includes a pair of electrodes as a first electrode 17a and a second electrode 17b that are disposed on a surface 15a of the board 15. The light-emitting element 11 is disposed on the board 15 with the first element electrode 13a of the light-emitting element 11 in contact with the first electrode 17a of the board 15 and with the second element electrode 13b of the light-emitting element 11 in contact with the second electrode 13b of the board 15.

The lower surface 12c of the body 12 is disposed to be parallel with the surface 15a of the board 15 (the upper surface of the board in the drawing). The lower surface 14c of the support 14 and the lower surface 12c of the body are mounted on the surface of the board 15. The surface of the board 15 includes the first electrode 17a and/or the second electrode 17b and/or a surface of the board 15 itself.

For a light-emitting element 11, there are light-emitting elements to emit various colors of light: blue emission, red emission, green emission, yellow emission, and so on can be selected. In a combination with a light-emitting element and a phosphor, more color variations of light can be achieved. For example, in the case of a blue light-emitting element with a combination of a phosphor to radiate a white luminescent color for general lighting can be achieved, and a gallium nitride compound semiconductor as a blue light-emitting element has been well-known. This blue light-emitting element includes a substrate made of sapphire glass and a diffusion layer (a P layer and an N layer) having diffusional growth of a P semiconductor portion and an N semiconductor portion on this substrate. The P semiconductor portion includes a P electrode and the N semiconductor portion includes an N electrode, and the exposed parts of this P electrode serves as the first element electrode 13a and N electrode serves as the second element electrode 13b.

When the blue light-emitting element is used to emit white light, a phosphor that converts at least part of light emitted from the blue light-emitting element may be used. If the front surface 12a of the body 12 of the light-emitting element 11 is a light-emitting surface, a phosphor may be disposed on the front surface 12a of the body 12 of the light-emitting element 11. If the peripheral side surface 12a, 12f, 12d except the rear surface 12b is a light-emitting surface, a phosphor may be disposed on the peripheral side surface 12a, 12f, 12d of the body 12 of the light-emitting element 11 except the rear surface 12b of the body 12 of the light-emitting element 11. Of course, if the upper surface 12e is a light-emitting surface, a phosphor may be disposed on the upper surface 12e of the body 12 of the light-emitting element 11.

Further, in the case of a red light-emitting element, a PN structure is the same as that of the blue light-emitting element, but an aluminum gallium arsenide semiconductor or a gallium arsenide phosphorus semiconductor may be used to form the red light-emitting element.

In the body 12, the energization between the pair of element electrodes, the first element electrode 13a and the second element electrode 13b, causes emission of a predetermined luminescent color around a PN junction 16 where the P layer and the N layer are combined.

Figure 2:
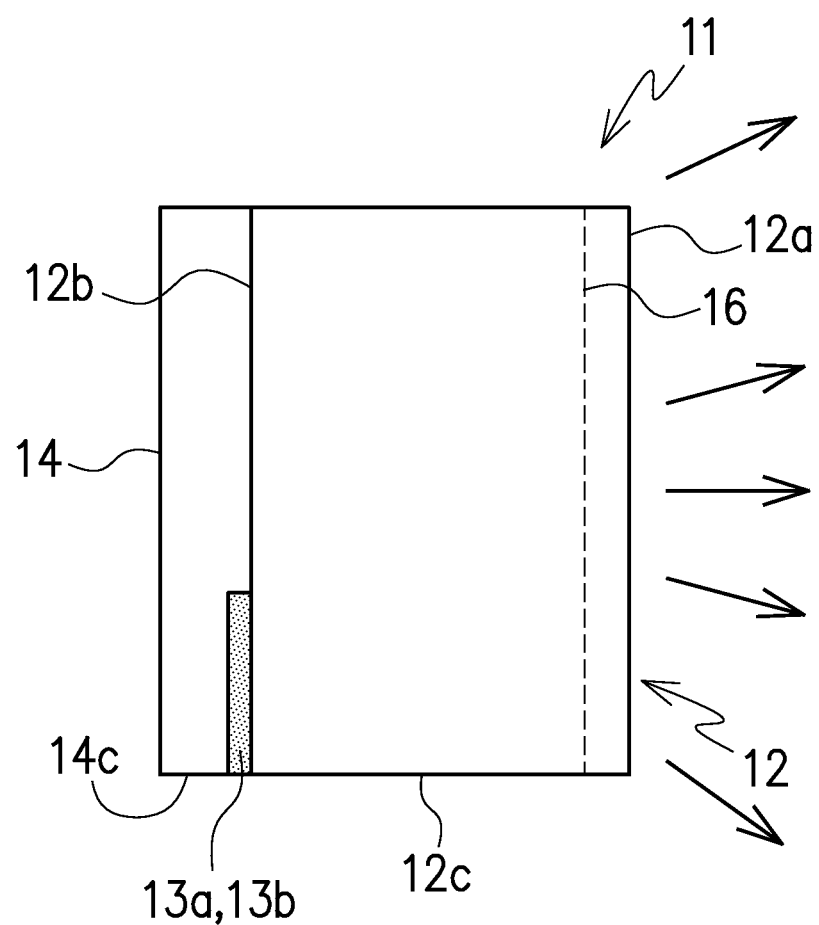
FIG. 2 is a side view of the light-emitting element shown in FIG. 1, as viewed from one side surface of the peripheral side surfaces.

The support 14 disposed at the rear surface 12b of the body 12 is formed by protruding from a central area of the rear surface 12b in a rectangular parallelepiped shape. The support 14, as shown in FIGS. 1 and 2, includes the lower surface 14c continuous with at least the lower surface 12c of the body 12 in the same plane. The lower surface 14c of the support 14 that is positioned rearward of the first element electrode 13a and the second element electrode 13b supports and holds the light-emitting element 11 on the surface of the board (see FIGS. 3 and 4).

Figure 4:
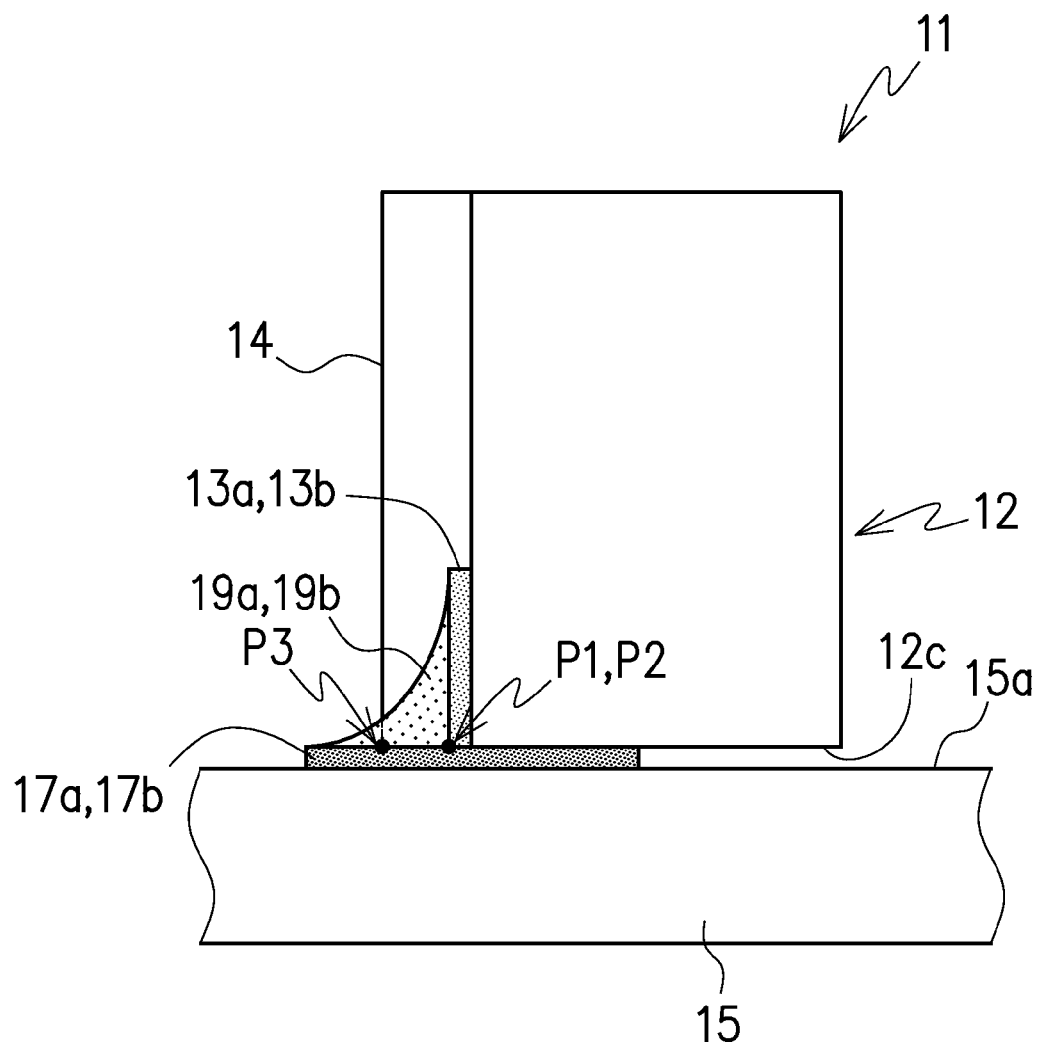
FIG. 4 is a side view illustrating a second mounting embodiment to mount the light-emitting element on the board of the lighting device.

FIG. 3 shows a first mounting embodiment and FIG. 4 shows a second mounting embodiment, and the light-emitting element 11 is mounted on the surface 15a of the board 15. The first element electrode 13a of the light-emitting element 11 is electrically connected to the first electrode 17a of the board 15 by a first solder 19a, and the second element electrode 13b of the light-emitting element 11 is electrically connected to the second electrode 13b of the board 15 by a second solder 19b.

In a first mounting embodiment shown in FIG. 3, the first solder 19a provided on a first electrode 17a of the board 15 is in contact with the lower surface of the first element electrode 13a for electrical connection, and the second solder 19b provided on a second electrode 17b of the board 15 is in contact with the lower surface of the second element electrode 13b for electrical connection. In this embodiment, the first solder 19a is in contact with the lower surface 12c of the body 12 and the lower surface 14c of the support 14 as well as the lower surface of the first element electrode 13a, the second solder 19b is in contact with the lower surface 12c of the body 12 and the lower surface 14c of the support 14 as well as the lower surface of the second element electrode 13b.

Further, in a second mounting embodiment shown in FIG. 4, the first solder 19a is positioned on the first element electrode 13a and in contact with a rear surface of the first element electrode 13a, and the second solder 19b is positioned on the second element electrode 13b and in contact with a rear surface of the second element electrode 13b. The first element electrode 13a is electrically connected to the first electrode 17a of the board 15 by the first solder 19a, and the second element electrode 13b is electrically connected to the second electrode 17b of the board 15 by the second solder 19b.

As shown in FIGS. 3 and 4, in the first and second mounting embodiments, a supporting portion P3 that is a rear edge of a lower surface of the support 14 and the supporting portion P3 is positioned rearward of a first connecting portion P1 that is a rear edge of the lower surface of the first element electrode and rearward of a second connecting portion P2 that is a rear edge of the lower surface of the second element electrode 17b.

Figure 12:
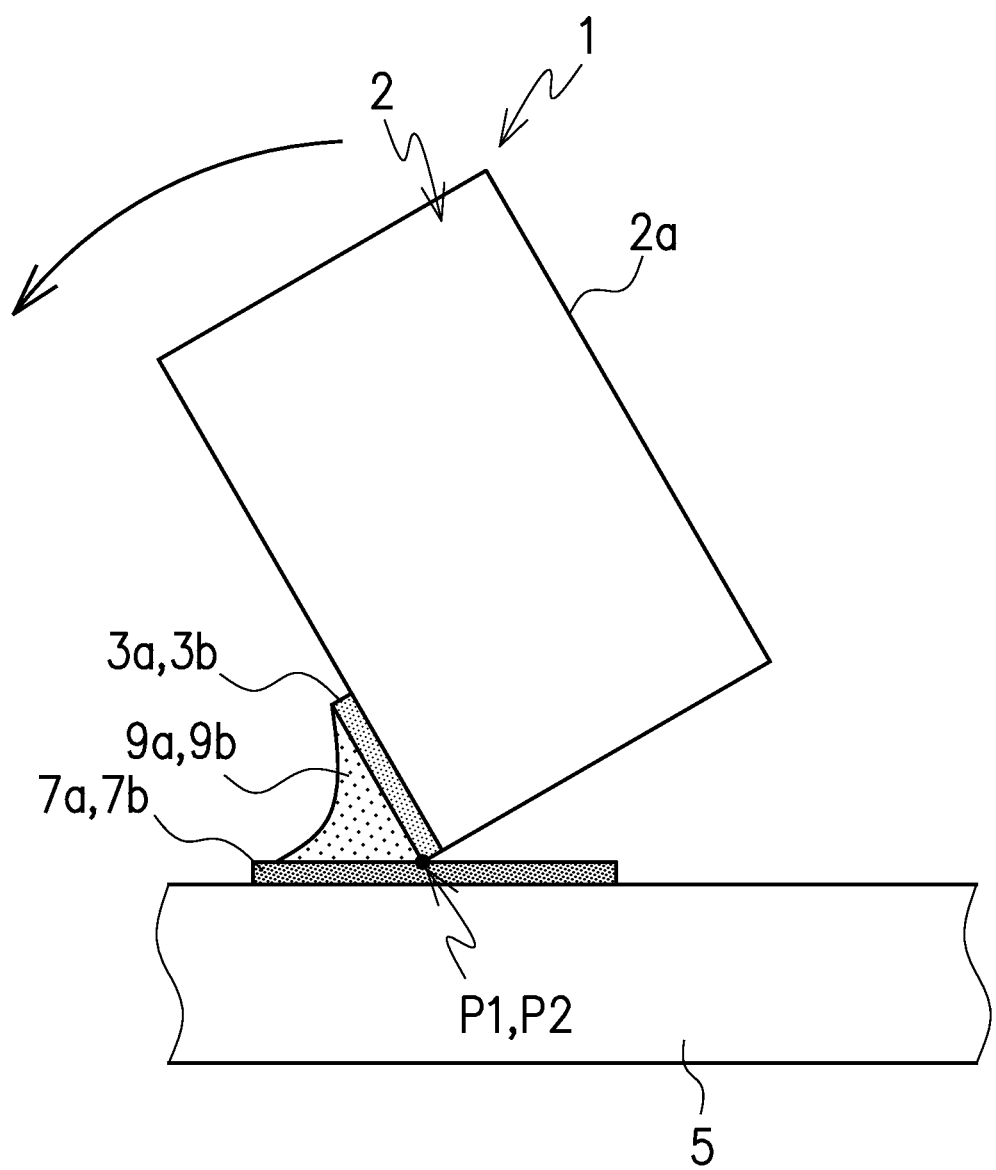
FIG. 12 is an explanation drawing showing a change of solder, which draws the light-emitting element rearward on the surface of the board without a support.

Regarding the light-emitting element 1 without a support as shown in FIG. 12, there are the first connecting portion P1 and the second connecting portion P2 is aligned with each other, however, there is no supporting portion that is positioned rearward of the first connecting portion P1 and the second connecting portion P2.

On the other hand, in the present invention, since the supporting portion P3 supports the entire light-emitting element 11 from rearward of the first connecting portion P1 and the second connecting portion P2, the light-emitting element 11 can be stably positioned even when the light-emitting element 11 is soldered. Accordingly, in the first and second mounting embodiments, inclination of the light-emitting element 11, which is caused by the surface tension of the first solder 19a and the second solder 19b, can be effectively prevented.

Second Embodiment

A light-emitting element 21 includes a body 22 that includes an upper surface 22e, a lower surface 22c opposite to the upper surface 22e, a peripheral side surface extending between peripheral edges 22e' of the upper surface 22e and peripheral edges 22c' of the lower surface 22c, and the peripheral side surface including a front surface 22a and a rear surface 22b opposite to the front surface 22a, a pair of element electrodes as a first element electrode 23a and a second element electrode 23b positioned at the rear surface 22b, and a support 24 disposed on the rear surface 22b of the body 22 between the first element electrode 23a and the second element electrode 23b positioned at the rear surface 22b of the body 12.

In this embodiment, the lower surface 24a of the support 24 includes a slope that slopes upward from a position that is adjacent to the lower surface 22c of the body 22.

Figure 5:
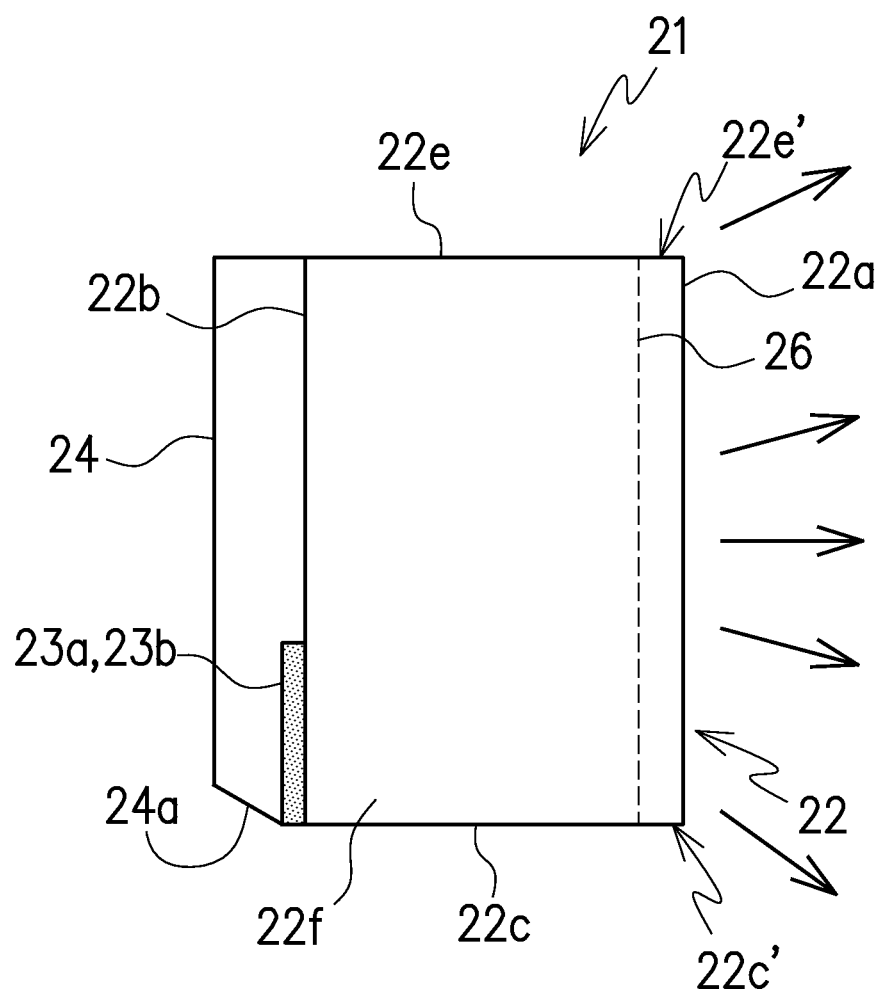
FIG. 5 is a side view of a light-emitting element according to a second embodiment of the present invention.
Figure 6:
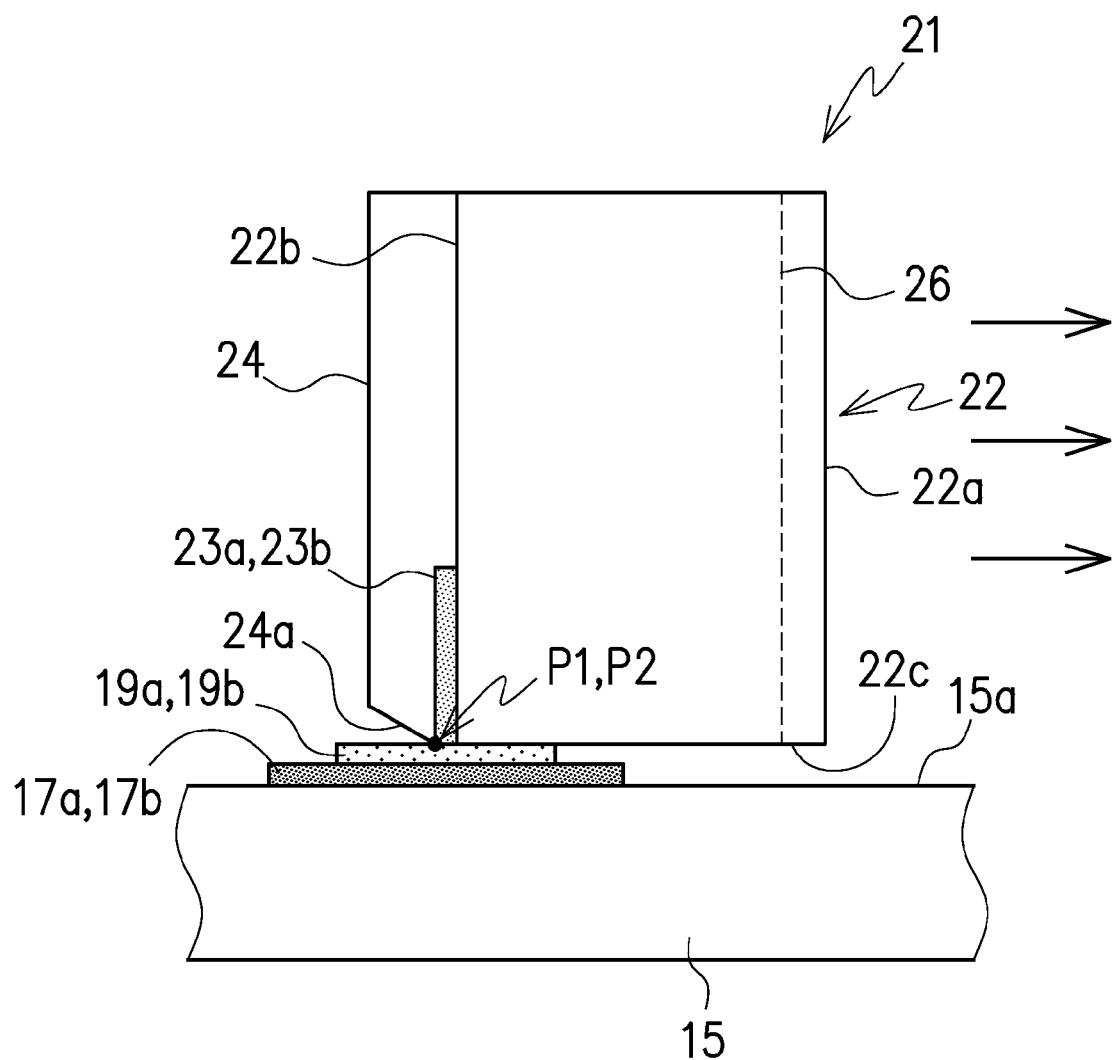
FIG. 6 is a side view illustrating a first mounting embodiment to mount the light-emitting element of the second embodiment on a board of a lighting device.
Figure 7:
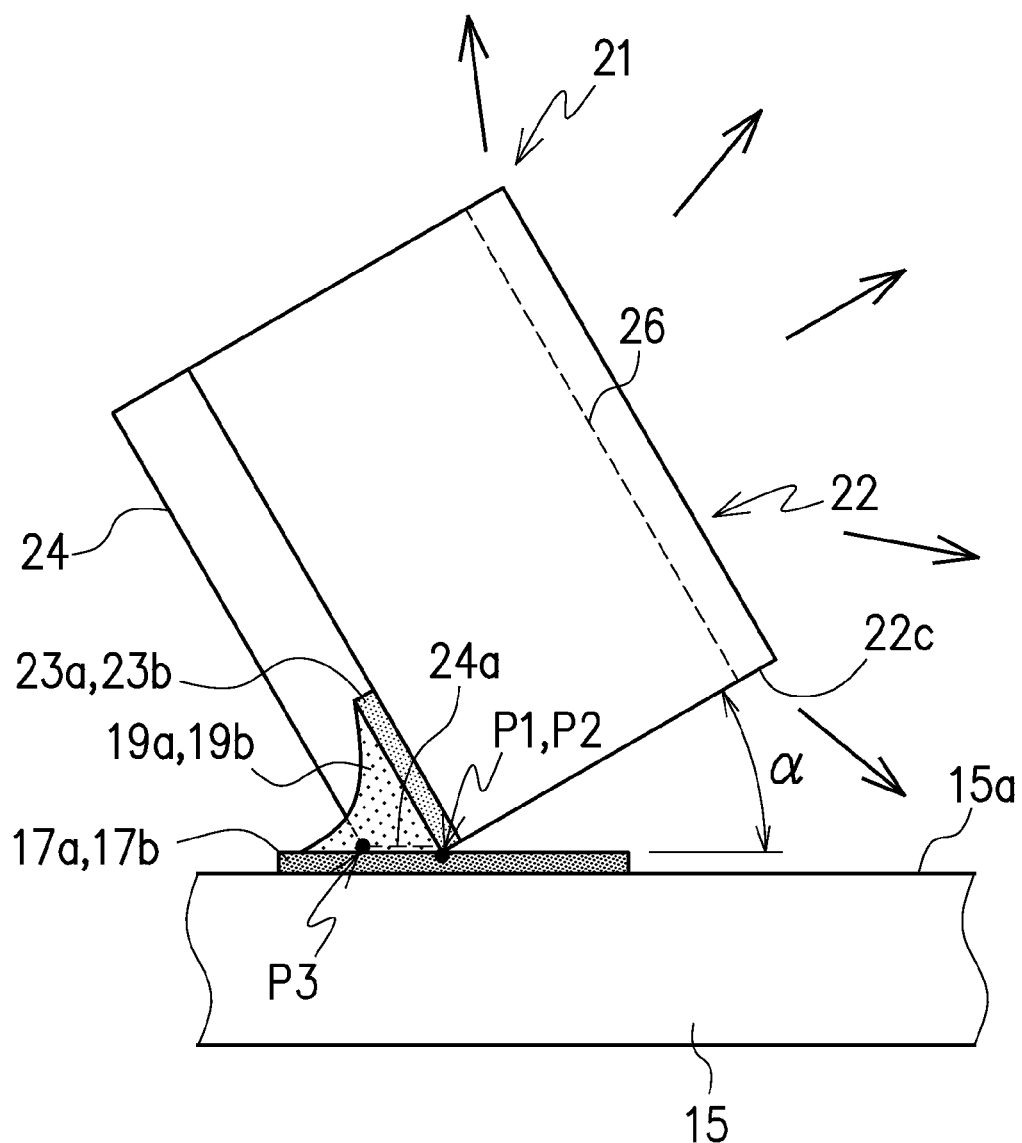
FIG. 7 is a side view illustrating a second mounting embodiment to mount the light-emitting element of the second embodiment on a board of the lighting device.

FIGS. 5 to 7 show the light-emitting element 21 according to the second embodiment of the present invention. The slope of the lower surface 24a can be disposed to be in contact with a surface 15a of a board 15, when the light-emitting element 21 is used in a lighting device. With the slope, the light-emitting element 21 can be disposed on the surface 15a of the board 15 with an angle with respect to the surface 15a of the board 15, as shown in FIG. 7.

The lighting device may include a board 15 including a pair of electrodes as a first electrode 17a and a second electrode 17b that are disposed on a surface 15a of the board 15 with the first element electrode 23a of the light-emitting element 21 in contact with the first electrode 17a of the light-emitting element 21 and with the second element electrode 17b of the light-emitting element 21 in contact with the second electrode 17b of the board 15, and the lower surface 24a of the support 24 is in contact with the board 15.

In the first mounting embodiment described in FIG. 6, the first element electrode 13a of the light-emitting element 21 is electrically connected to the first electrode 17a of the board 15 by a first solder 19a, and the second element electrode 13b of the light-emitting element 21 is electrically connected to the second electrode 13b of the board 15 by a second solder 19b.

In a first mounting embodiment shown in FIG. 6, the first solder 19a provided on a first electrode 17a of the board 15 is in contact with the lower surface of the first element electrode 23a for electrical connection, and the second solder 19b provided on a second electrode 17b of the board 15 is in contact with the lower surface of the second element electrode 23b for electrical connection. In this embodiment, the first solder 19a is in contact with the lower surface 22c of the body 22 and the lower surface 14c of the support 14 as well as the lower surface of the first element electrode 23a, the second solder 19b is in contact with the lower surface 22c of the body 22 and the lower surface 14c of the support 14 as well as the lower surface of the second element electrode 23b.

In this mounting embodiment, the light-emitting direction of light from the front surface 22a adjacent to a PN junction 26 is approximately parallel with the surface 15a of the board 15.

On the other hand, in the second mounting embodiment described in FIG. 7, the light-emitting element 21 is mounted on the board 15 with the lower surface 24a of the support 24. The lower surface 24a of the support 24 is in contact with the surface 15a of the board 15. The lower surface 24a of the support 24 may be in contact with the first electrode 23a and/or the second electrode 23b of the pair of the electrodes disposed on the surface 15a of the board 15. The first element electrode 23a is electrically connected to the first electrode 17a of the board 15 by a first solder 19a, and the second element electrode 23b of the light-emitting element 21 is electrically connected to the second electrode 17b of the board 15 by a second solder 19b.

Specifically, the slop of the lower surface 24a of the support 24 is mounted to abut on the surface 15a of the board 15 to hold the light-emitting element 21 with the front surface 22a side of the body 22 being uplifted and inclined with respect to the surface 15a of the board 15. Then, the first solder 19a is disposed between a rear surface of the first element electrode 23a and an upper surface of the first electrode 17a of the board 15, and the second solder 19b is disposed between a rear surface of the first element electrode 23a and an upper surface of the second electrode 17b of the board 15. The light-emitting element 21 disposed with the first solder 19a and the second solder 19b through a reflow process electrically connected and adhered on first electrode 17a and the second electrode 17b disposed on the surface 15a of the board 15 at the angle of slope included in the lower surface 24a of the support 24.

Furthermore, in this embodiment, the first element electrode 23a positioned at the rear surface 22b of the body 22 is disposed at the position that is adjacent to a first side surface 22d of the body 22 and the lower surface 22c of the body 22, and the second element electrode 23b is disposed at the position that is adjacent to a second side surface 22f of the body 22 and the lower surface 22c of the body 22.

In this second mounting embodiment, the connecting portion P1 of the first element electrode 23a is disposed to be in contact with the upper surface of the first electrode 17a, and the connecting portion P2 of the second element electrode 23b is disposed to be in contact with the upper surface of the second electrode 17b. The first element electrode 23a is positioned at a first lower corner of the rear surface of the body, and the second element electrode 23b is positioned at a second lower corner opposite to the first lower corner of the rear surface 22b of the body 22. In this embodiment, the supporting portion P3 is positioned rearward of the first connecting portion P1 and the second connecting portion that are aligned with each other in a side plan view.

Accordingly, the light-emitting element 21 is adhered and supported by at least these three portions, i.e., the first connecting portion P1 and the second connecting portion P2 and the supporting portion P3, with a predetermined slope angle α being kept. This slope angle α between the lower surface of the body 22 and the surface 15a of the body 15 is proportional to the sloping degree of the lower surface 24a of the support 24. Accordingly, the light-emitting element 21 can be arranged with an angle that is to be decided based on the arrangement of an irradiated subject. The light-emitting element 21 can emit light in more directions with this arrangement, for example, from the front surface 22a, the upper surface 22e, the lower surface 22c, the first side surface 22a and the second side surface 22f.

This prevents light emitted around the PN junction 26 on the lower surface 22c side from being absorbed to the board 15 and allows a wide area on the front surface 22a side of the body 22 to be brightly irradiated.

Thus, in the light-emitting element 21 of this embodiment, the slope angle of the lower surface 24a of the support 24 is set to a predetermined angle in advance before the light-emitting element 21 is mounted on the board 15, and it is possible to hold the light-emitting element 21 with this slope angle even after a reflow process.

Third Embodiment

A light-emitting element 31 of this embodiment includes a body 32 that includes an upper surface 32e, a lower surface 32c opposite to the upper surface 32e, a peripheral side surface extending between peripheral edges 32e' of the upper surface 32e and peripheral edges 32c' of the lower surface 32c. The peripheral side surface includes a front surface 32a and a rear surface 32b opposite to the front surface 32a, a pair of element electrodes as a first element electrode 33a positioned at a first lower corner of the rear surface 32b of the body 32 and a second element electrode 33b positioned at a second lower corner of the rear surface 32b of the body 32. The light-emitting element 31 includes a support 34 that is disposed on the rear surface 32b of the body 32 between the first element electrode 33a and the second element electrode 33b positioned at the lower portion of the rear surface 32b of the body 32.

The support 34 includes an upper surface 34e and a lower surface 34c opposite to the upper surface 34e, and the upper surface 34e of the support 34 is flush with the upper surface 32e of the body 32. The peripheral surface of the body 32 further includes a first side surface 32d and a second side surface 32f opposite to the first side surface 32d.

The support 34 further includes a first side surface 34d, a second side surface 34f opposite to the first side surface 34d, a first cut portion A cut into a first lower corner of the support 34, and a second cut portion B cut into a second lower corner of the support 34. The first side surface 34d of the support 34 is flush with the first side surface 32d included in the peripheral surface of the body 32 and the second side surface 34f of the support 34 is flush with the second side surface 32f included in the peripheral surface of the body 32. The first element electrode 33a appears at the first cut portion A of the support 34 and the second element electrode 33b appears at the second cut portion B of the support 34.

Figure 8:
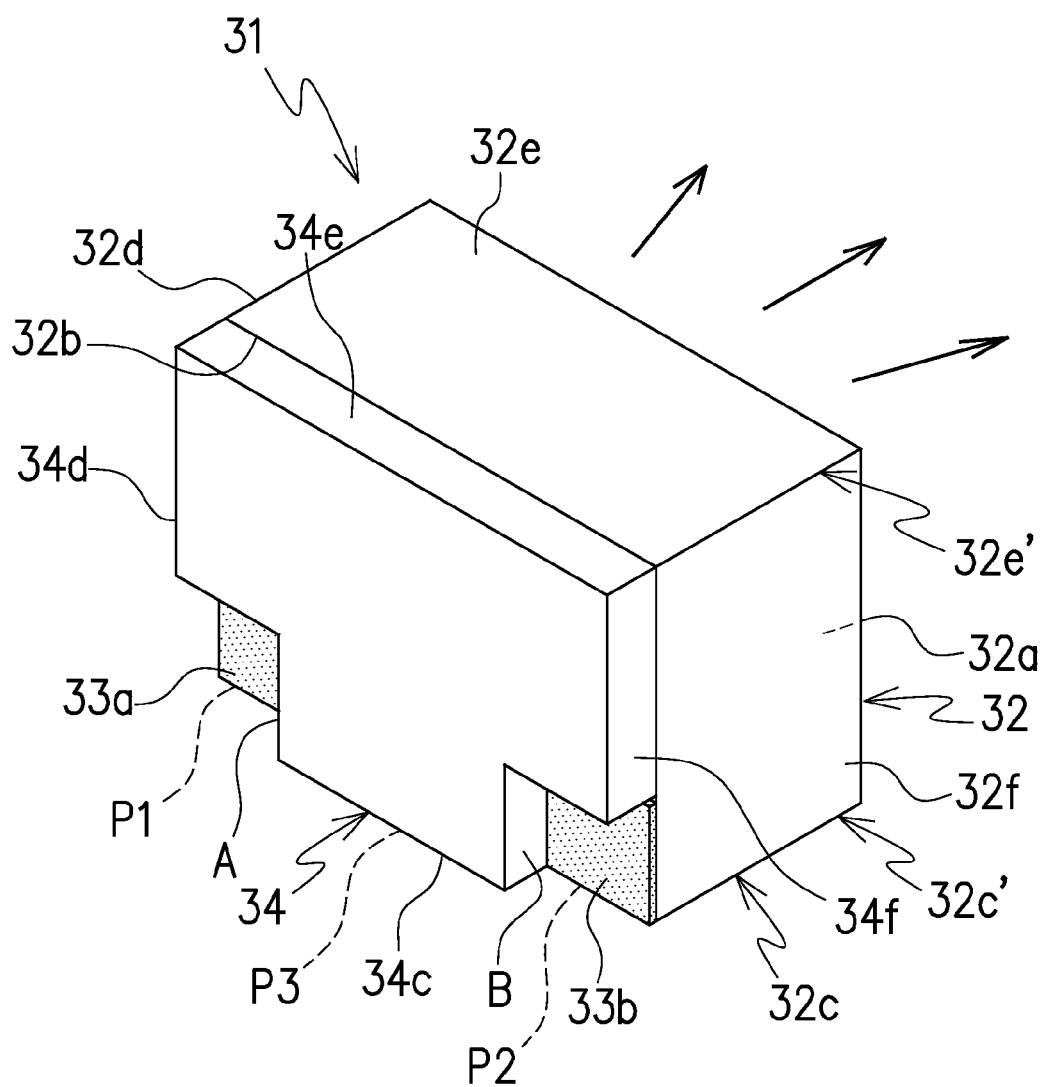
FIG. 8 is a perspective view of a light-emitting element according to a third embodiment of the present invention as viewed from a rear surface side.
Figure 9:
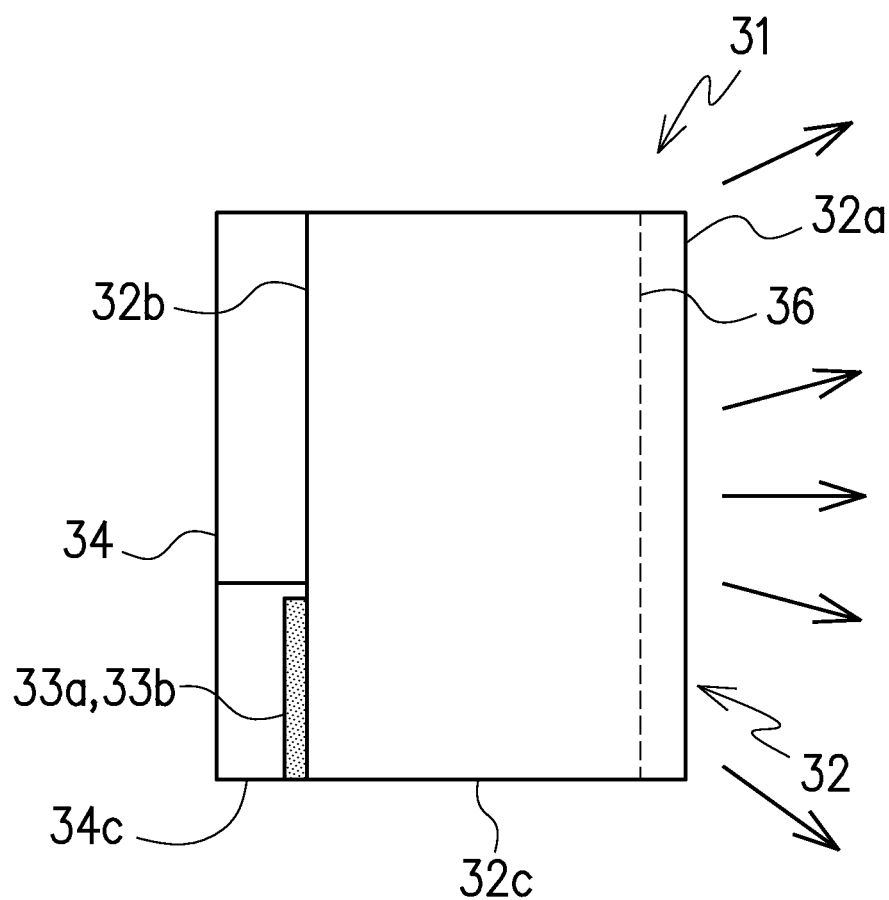
FIG. 9 is a side view of the light-emitting element according to the third embodiment.

FIGS. 8 to 11 show the light-emitting element 31 according to the third embodiment of the present invention. This light-emitting element 31 is different from those of the above embodiments in terms of the shape of the support 34 disposed to be projected on the rear surface 32b of the body 32. Specifically, the support 34 is formed over the rear surface 32b except the first element electrode 33a is disposed at a first lower corner and the second element electrode 33b is disposed at a second lower corner of the rear surface 32b of the body 32. The support 34 appears a shape resembling T in a rear view. Further, the lower surface 34c of the support 34 is formed as a horizontal surface continuous with the lower surface 32c of the body 32 in the same plane, as shown in FIG. 9.

Figure 10:
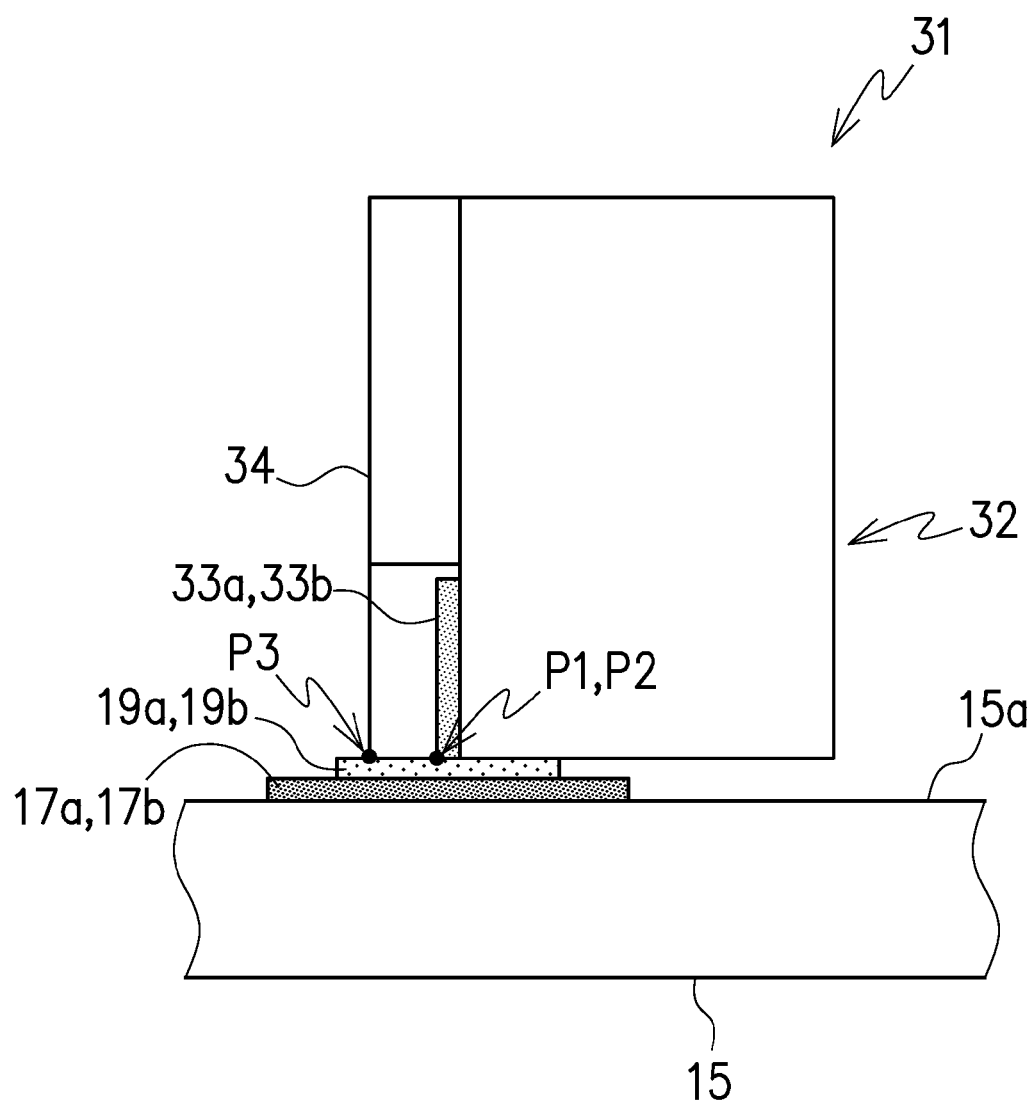
FIG. 10 is a side view illustrating a first mounting embodiment to mount the light-emitting element of the third embodiment on a surface of a board of the lighting device.

Accordingly, as shown in FIG. 10, the lower surface 32c of the light-emitting element 31 is placed on the surface 15a of the board 15. The first element electrode 33a is adhered to the first electrode 17a formed on the surface 15a of the board 15 by the first solder 19a, and the second element electrode 33b is adhered to the second electrode 17b formed on the surface 15a of the board 15 by the second solder 19b. In this case, even if the surface tension of the first solder 19a and the second solder 19b generate adjacent to the first connecting portion P1 and the second connecting portion P2, the supporting portion P3 of the support 14 at a position rearward of the first connecting portion P1 and the second connecting portion P2 supports the light-emitting element 31 on the surface 15a of the board 15. Accordingly, even when a first solder 19a is provided at the first element electrode 13a of the light-emitting element 11 and at the first electrode 17a of the board 15, and a second solder 19b is provided at the second element electrode 13b of the light-emitting element 11 and at a second electrode 17b of the board 15, a position of the light-emitting element to the surface 15a of the board 15 can be maintained.

Further, as shown in FIG. 8, the first element electrode 33a of the pair of element electrodes is positioned at the bottom of a first hollow portion formed by the first cut portion A of the support 34, and the second element electrode 33b of the pair of element electrodes is positioned at the bottom of a second hollow portion formed by the second cut portion B of the support 34. The first solder 19a is disposed in the first hollow at the first cut portion A, and the second solder 19b is disposed in the second hollow at the second cut portion B.

Figure 11:
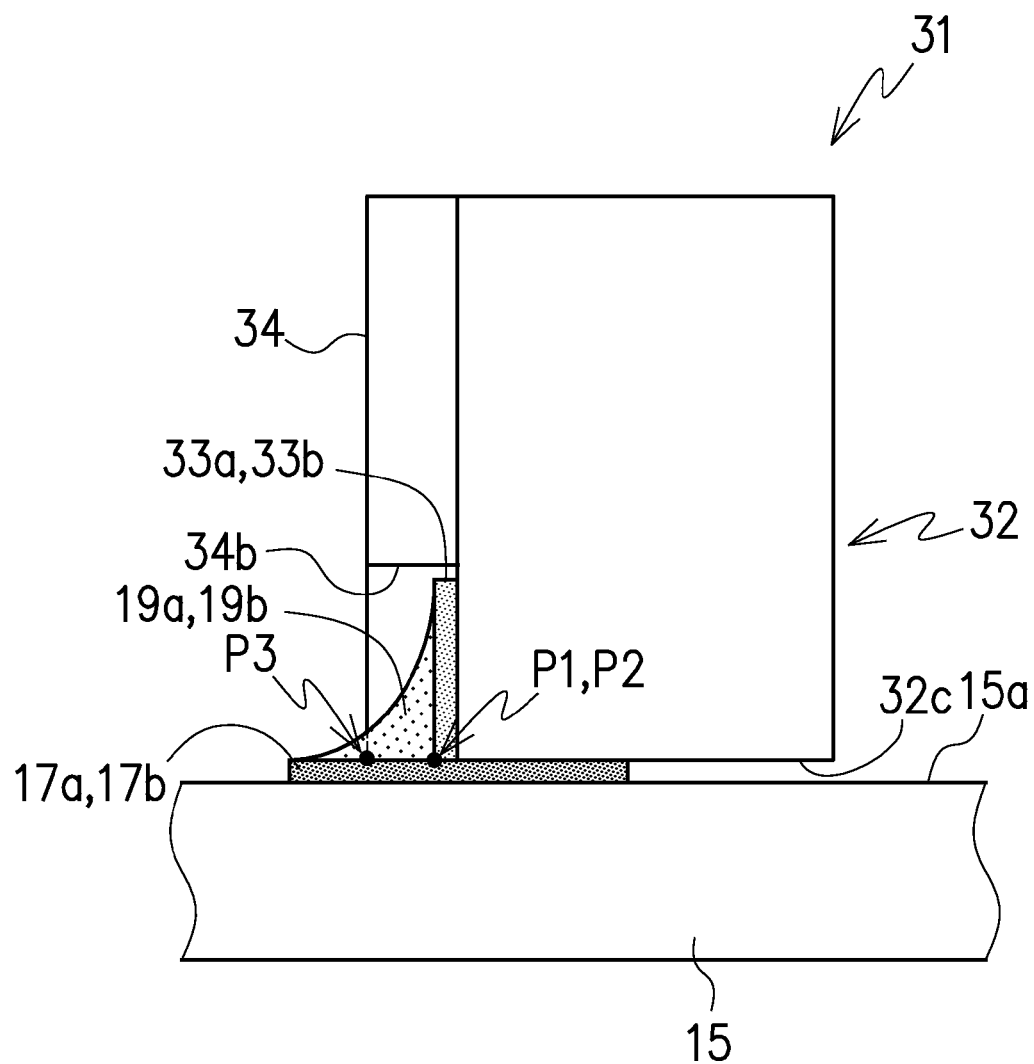
FIG. 11 is a side view illustrating a second mounting embodiment to mount the light-emitting element according to the third embodiment on the board of the lighting device.

As shown in FIG. 11, the amount of the first solder 19a disposed at the first cut portion A to be applied on the surface of the first element electrode 33a and the first electrode 17a, and the amount of the second solder 19b disposed at the second cut portion B to be applied on the surface of the second element electrode 33b can be adjusted and the first solder 19a can be held in the first hollow and the second solder 19b can be held in the second hollow, even if the amount of solders is increased.

Moreover, since the support 34 is T-shaped, its center of gravity can be at the upper side of the rear surface 32b of the body 32, and the lower surface of the support 34 in contact with the surface 15a of the board 15 at a position rearward of the first solder 19a and the second solder 19b can support the body 32 of the light-emitting element 31 on the surface 15a of the board 15. In this embodiment, the front surface 32a adjacent to the PN junction 36 may be a light-emitting surface of the light-emitting element 31, and the light-emitting direction may be parallel with the surface 15a of the board 15.

As described above, a light-emitting element according to an embodiment of the present invention includes a support disposed on the rear surface of the body, the light-emitting element can be stably mounted straight on a board or even at an angle with respect to the surface of the board.

Further, the support can be a part of the body, and it is possible not to increase the number of parts. Of course, any two or more structural portions of the light-emitting elements described herein can be combined and/or integrated, if necessary.

What is claimed is:

1. A light-emitting element comprising:
a body including an upper surface, a lower surface opposite to the upper surface, a peripheral side surface extending between peripheral edges of the upper surface and peripheral edges of the lower surface, and the peripheral side surface including a front surface and a rear surface opposite to the front surface;
a pair of element electrodes as a first element electrode and a second element electrode that are positioned at the rear surface of the body; and
a support disposed on the rear surface of the body between the first element electrode and the second element electrode positioned at the rear surface of the body, the support including an upper surface and a lower surface opposite to the upper surface, and the upper surface of the support being flush with the upper surface of the body.

2. The light-emitting element according to claim 1:
the upper surface of the body being a light-emitting surface; and
a phosphor disposed on the upper surface of the body.

3. The light-emitting element according to claim 1:
the lower surface of the support being flush with the lower surface of the body.

4. The light-emitting element according to claim 1:
the lower surface of the support includes a slope that slopes upward from a position that is adjacent to the lower surface of the body.

5. The light-emitting element according to claim 1:
the support appearing a shape resembling I in a rear plan view.

6. The light-emitting element according to claim 1:
the peripheral surface of the body including a first side surface and a second side surface opposite to the first side surface;
the support further including a first side surface, a second side surface opposite to the first side surface, a first cut portion cut into a first lower corner of the support, and a second cut portion cut into a second lower corner of the support;
the first side surface of the support being flush with the first side surface included in the peripheral surface of the body and the second side surface of the support being flush with the second side surface included in the peripheral surface of the body; and
the first element electrode appearing at the first cut portion, and the second element electrode appearing at the second cut portion.

7. The light-emitting element according to claim 6:
the support appearing a shape resembling T in a rear plan view.

8. The light-emitting element according to claim 1:
the front surface of the body being a light-emitting surface; and
a phosphor disposed on the front surface of the body.

9. The light-emitting element according to claim 1:
the peripheral side surface of the body except the rear surface being a light-emitting surface; and
a phosphor disposed on the peripheral side surface of the body except the rear surface.

10. A lighting device comprising:
a board including a pair of electrodes as a first electrode and a second electrode that are disposed on a surface of the board;
the light-emitting element of claim 1 being disposed on the board with the first element electrode of the light-emitting element in contact with the first electrode of the board and with the second element electrode of the light-emitting element in contact with the second electrode of the board,
the lower surface of the body of the light-emitting element being disposed to be parallel with the surface of the board.

11. The lighting device according to claim 10 comprising:
a phosphor disposed above the light-emitting element.

12. The lighting device according to claim 10:
the first element electrode of the light-emitting element being electrically connected to the first electrode of the board by soldering, and the second element electrode of the light-emitting element being electrically connected to the second electrode of the board by soldering.

13. A lighting device comprising:
a light-emitting element comprising: a body including an upper surface, a lower surface opposite to the upper surface, a peripheral side surface extending between peripheral edges of the upper surface and peripheral edges of the lower surface, and the peripheral side surface including a front surface and a rear surface opposite to the front surface; a pair of element electrodes as a first element electrode and a second element electrode that are positioned at the rear surface of the body; and a support disposed on the rear surface of the body between the first element electrode and the second element electrode positioned at the rear surface of the body, and the lower surface of the support including a slope that slopes upward from a position that is adjacent to the lower surface of the body; and
a board including a pair of electrodes as a first electrode and a second electrode that are disposed on a surface of the board;
the light-emitting element being disposed on the board with the first element electrode of the light-emitting element in contact with the first electrode of the board and with the second element electrode of the light-emitting element in contact with the second electrode of the board; and
the lower surface of the support being in contact with the board.

14. The lighting device according to claim 13 comprising:
a phosphor disposed above the light-emitting element.

15. The lighting device according to claim 13:
the first element electrode of the light-emitting element being electrically connected to the first electrode of the board by soldering, and the second element electrode of the light-emitting element being electrically connected to the second electrode of the board by soldering.

16. The lighting device according to claim 13:
wherein the lower surface of the body of the light-emitting element is disposed at an angle with respect to the surface of the board.

17. The lighting device according to claim 13:
wherein the lower surface of the support is in contact with either the first electrode or the second electrode of the pair of the electrodes disposed on the surface of the board.

* * * * *